United States Patent [19]
Chang et al.

[11] Patent Number: 5,610,088
[45] Date of Patent: Mar. 11, 1997

[54] METHOD OF FABRICATING FIELD EFFECT TRANSISTORS HAVING LIGHTLY DOPED DRAIN REGIONS

[75] Inventors: Kuang-Yeh Chang, Los Gatos; Yowjuang W. Liu, San Jose, both of Calif.

[73] Assignee: Advanced Micro Devices, Inc., Sunnyvale, Calif.

[21] Appl. No.: 405,321

[22] Filed: Mar. 16, 1995

[51] Int. Cl.$^6$ .................. H01L 21/265; H01L 21/8238
[52] U.S. Cl. .................. 437/34; 437/44; 437/57
[58] Field of Search .................. 437/44, 415 W, 437/405 W, 34, 57

[56] References Cited

U.S. PATENT DOCUMENTS

| | | |
|---|---|---|
| 4,764,477 | 8/1988 | Chang et al. . |
| 5,200,351 | 4/1993 | Hadjizadeh-Amini . |
| 5,262,664 | 11/1993 | Jung-Suk .................. 257/344 |
| 5,424,234 | 6/1995 | Kwon .................. 437/44 |
| 5,491,099 | 2/1996 | Hsu .................. 437/35 |

OTHER PUBLICATIONS

Wolf, "Silicon Processing for the VLSI Era: vol. 2: Process Integration", pp. 432–441, 1990, Lattice Press, month unknown.

*Primary Examiner*—John Niebling
*Assistant Examiner*—Richard A. Booth
*Attorney, Agent, or Firm*—Fliesler Dubb Meyer & Lovejoy LLP

[57] ABSTRACT

A method of fabricating an FET or CMOS transistor that includes lightly doped drain ("LDD") regions which minimizes oxide loss while requiring a lesser number of masks. Consequently, manufacturing cost, cycle times and yield loss can be minimized. In one aspect, the present invention provides a method of fabricating an FET having a LDD region using only one mask, comprising the sequential steps of (a) providing a substrate having an active region defined by field oxide regions; (b) providing a gate, having side edges, overlying a portion of said active region; (c) forming a barrier material layer over said substrate including said gate; (d) forming an oxide layer over said barrier material layer; (e) selectively etching said oxide layer with respect to said barrier material layer to form oxide sidewall spacers about the side edges of said gate; (f) implanting heavily doped source and drain regions about the side edges of said gate using said oxide sidewall spacers as masks; (g) removing said oxide sidewall spacers; and (h) implanting the lightly doped drain region about one of the side edges of said gate adjacent to said heavily doped drain region.

21 Claims, 6 Drawing Sheets

METHOD OF FABRICATING FIELD EFFECT TRANSISTORS HAVING LIGHTLY DOPED DRAIN REGIONS

CROSS-REFERENCE TO RELATED APPLICATION

A METHOD OF FABRICATING LDD MOS TRANSISTORS UTILIZING HIGH ENERGY ION IMPLANT THROUGH AN OXIDE LAYER, Inventors K. Y. Chang, Mark I. Gardner and Fred Hause, Ser. No. 08/357,676, filed Dec. 16, 1994, assigned to the Assignee of the subject Application.

FIELD OF THE INVENTION

The present invention generally relates to the fabrication of field effect transistors (FETs) having lightly doped drain (LDD) regions; more particularly, this invention describes a new method of forming LDD regions.

BACKGROUND OF THE INVENTION

Lightly doped drain (LDD) regions have commonly been used to reduce the hot electron effect in a field effect transistor (FET). This is made possible by providing LDD regions which separate the source and drain regions from the channel region, thereby reducing the electric field at the source and drain pinch-off regions, and thus increasing the channel breakdown voltage and reducing electron impact ionization (hot electron effects).

An FET having LDD regions is typically fabricated in an active region of a substrate. The active region has a P-type background doping and is bounded by field oxide (FOX) regions which electrically isolate the FET from other devices formed in the same substrate. To form an N-channel FET, the conventional processing techniques implant regions located at both ends of a gate with a light dose of an N-type dopant using the gate as a mask. Two N regions formed by the implant define a channel underlying the gate. A spacer material layer is formed over the entire structure and etched so that spacers remain at the ends of the gate. These spacers overlie portions of the $N^-$ regions adjacent to the gate structures. Thereafter, a second implant is performed with a heavier dose of an N-type dopant to form $N^+$ source and drain regions in the $N^-$ regions. During the second implant, the spacers mask the underlying $N^-$ regions. The $N^-$ regions which do not receive the second implant become the LDD regions. Thus, the width of the spacers defines the width of the LDD regions.

The conventional manner of forming spacers is to perform a blanket etch of a spacer material layer, typically an oxide layer, which is provided over the entire area of the substrate. However, because of non-uniformities of the etching rate over the entire wafer area, there may be a removal of materials from the field oxide, referred to as oxide loss which undesirably reduces the threshold voltage of the FET.

One method of reducing oxide loss is to use an etch stop layer, for example, a silicon nitride ($Si_3N_4$) layer, overlying the substrate, the gate, and the field oxide regions of a partially fabricated FET prior to forming the spacer material layer. The spacer material is formed of a material which can be selectively etched with respect to the etch stop layer. An etchant is selected which selectively etches the spacer material layer so that the nitride layer will not be penetrated by the etchant either during the etching of the spacer material layer to form the LDD spacers or during the etching to remove the LDD spacers. Such a method is described in U.S. Pat. No. 5,200,351 issued Apr. 6, 1993, to Zahra Hadjizadeh-Amini.

While the above method is able to reduce oxide loss, it involves four masking steps to form the source, drain and LDD regions in a typical Complementary Metal Oxide Silicon (CMOS) LDD fabrication process. The four masking steps are: an $N^-$ mask to form the $N^-$ regions, a $P^-$ mask to form the $P^-$ regions, an $N^+$ mask to form $N^+$ source and drain regions and a $P^+$ mask to form the $P^+$ source and drain regions. Each masking step typically includes the sequential steps of preparing the substrate, applying the photoresist material, soft-baking, aligning and selectively exposing the photoresist to radiation by using a mask, baking, hard baking, developing the patterns in the resist, hard baking, implanting a desired dose of a dopant with the required conductivity type, stripping the photoresist, and then cleaning of the substrate. These processing steps associated with each masking step adversely increase cycle time and process complexity and also introduce particles and defects, resulting in an increase in cost and yield loss. Hence, there is a need to provide a method for forming FET and CMOS transistors with LDD regions which reduces oxide loss, while at the same time lessens the number of masking steps required. The present invention addresses such a need.

SUMMARY OF THE INVENTION

One aspect of the invention is to provide a method of forming and removing LDD spacers which reduces or eliminates oxide loss while minimizing process complexity.

Another aspect of the invention is to provide a method of forming and removing LDD spacers which uses an etch stop layer and a spacer material layer which are formed of materials which can be selectively etched with respect to each other and at the same time reducing the number of masking steps.

Still another aspect of the invention is to provide a method of fabricating an FET having LDD regions in which oxide loss is avoided and process complexity is minimized by reducing the number of masking steps.

Yet another aspect of the invention is to provide a method of fabricating CMOS transistors having LDD regions in which oxide loss is avoided and process complexity is minimized by reducing the number of masking steps.

These and other aspects and advantages of the present invention are accomplished by providing an etch stop layer, for example, a silicon nitride ($Si_3N_4$) layer, overlying the substrate, the gate, the active region and the field oxide regions of a partially fabricated FET prior to forming the spacer material layer. The spacer material layer is formed of a material which can be selectively etched with respect to the etch stop layer. If the etch layer is formed of nitride, the spacer material layer may be formed of an oxide of silicon, for example, $SiO_2$. An etchant is selected which selectively etches the spacer material layer so that the nitride layer will not be penetrated by the etchant either during the etching of the spacer material layer to form the LDD spacers. Thereafter, heavily doped source and drain regions are formed in the active region using a first mask (a $N^+$ or a $P^+$ mask) and the LDD spacers as masks. Next, the etchant is used to remove the LDD spacers without causing any oxide loss. The area of the active region which was originally covered by the LDD spacers and the heavily doped source and drain regions are then lightly doped using the same first mask. The area of the active region which was originally covered by the LDD spacers forms the LDD regions. Therefore, with the present invention, an FET requires only one mask (a $N^+$ or a $P^+$ mask), instead of two masks (a $N^+$ and a $N^-$ masks, or a $P^+$ and a $P^-$ masks) to form the source, drain and the LDD regions. Similarly, a CMOS transistor requires only two masks (a $N^+$ and a $P^+$ mask), instead of four masks (a $N^+$, a $N^-$, a $P^+$ and a $P^-$ masks) to form the source, drain and the LDD regions.

A method, in accordance with the present invention, of fabricating an FET having a lightly doped drain region using only one mask, comprises the sequential steps of (a) providing a substrate having an active region defined by field oxide regions; (b) providing a gate, having side edges, overlying a portion of said active region; (c) forming oxide sidewall spacers about the side edges of said gate; (d) implanting heavily doped source and drain regions about the side edges of said gate using said oxide sidewall spacers as masks; and (e) implanting the lightly doped drain region about the side edges of said gate adjacent to said heavily doped drain region.

The present invention is also concerned with providing a method of fabricating a CMOS transistor having first and second lightly doped drain regions with only two masks. The method comprises (a) providing a substrate having a first active region with a first conductivity type and a second active region with a second conductivity type defined by field oxide regions; (b) providing a first gate, having side edges, overlying a portion of said first active region, and a second gate, having side edges, overlying a portion of said second active region; (c) forming oxide sidewall spacers about the side edges of said first and second gates; (d) forming a first disposable barrier material layer over selected areas of the substrate including said second active region and excluding said first active region using a first mask; (e) implanting first heavily doped source and drain regions of said second conductivity type about the side edges of said first gate using said oxide sidewall spacers as second masks while said second active area is protected by said first disposable barrier material layer; (f) implanting the first lightly doped drain region of said second conductivity type about the side edges of said first gate adjacent to said first heavily doped drain region while said second active area is protected by said first disposable barrier material layer; (g) forming a second disposable barrier material layer over selected areas of the substrate including said first active region and excluding said second active region using a third mask; (h) implanting second heavily doped source and drain regions of said first conductivity type about the side edges of said second gate using said oxide sidewall spacers as fourth masks while said first active area is protected by said second disposable barrier material layer; and (i) implanting the second lightly doped drain region of said first conductivity type about the side edges of said second gate adjacent to said second heavily doped drain region while said first active area is protected by said second disposable barrier material layer.

By using the method of the present invention, FET or CMOS transistors having LDD regions can be fabricated with a lesser number of masking steps. Consequently, manufacturing cost, cycle times and yield loss can be minimized.

Still other aspects and advantages of the present invention will become readily apparent to those skilled in the art from the following detailed description, wherein only the preferred embodiments of the invention have been shown and described, simply by way illustration of the best mode contemplated by the inventors of carrying out the invention. As will be realized, the invention is capable of other and different embodiments, and its several details are capable of modifications in various respects, all without departing from the invention. Accordingly, the drawings and descriptions are to be regarded as illustrative in nature, and not as restrictive.

It will be appreciated that these drawings are for the purposes of illustration, and are therefore not necessarily drawn to scale.

DETAILED DESCRIPTION OF THE PREFERRED EMBODIMENTS:

The method of the present invention will be described with reference to the formation of a CMOS transistor having LDD regions. However, the method is applicable to other processes, for example, a process for forming N-channel MOS transistors, P-channel MOS transistors, or Bipolar-CMOS transistors (commonly known as BiCMOS transistors). Furthermore, the following detailed description is of the best modes presently contemplated by the inventors for practicing the invention. It should be understood that the descriptions of these preferred embodiments are merely illustrative and that they should not be taken in a limiting sense.

Figure 1A:
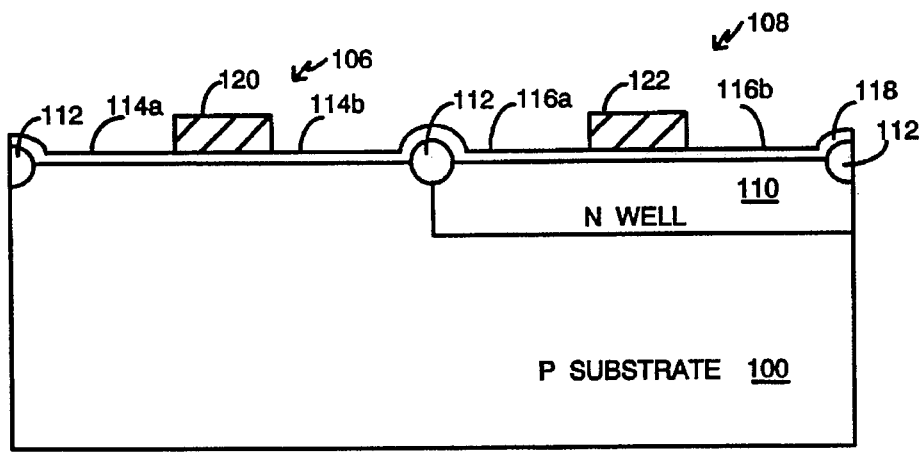
FIGS. 1A–1I are schematic, cross-sectional illustrations showing the various stages of a conventional LDD process for fabricating CMOS transistors which uses four masks.

FIGS. 1A through 1I illustrate a LDD drain process for fabricating CMOS transistors which uses four masks. FIG. 1A shows a P substrate (a wafer) 100 with an N-well region 110, and a N-channel transistor 106 and a P-channel transistor 108 formed thereon. The transistors 106 and 108 shown here are prior to source, drain and LDD ion implantation. Using conventional fabrication techniques, field oxide regions 112 are formed on the substrate 100 to define active regions 114a, 114b, 116a and 116b. A gate oxide layer 118 is provided on the active regions 114a, 114b, 116a and 116b and also over the field oxide regions 112. Thereafter, gate structures 120 and 122 are formed on the active regions 114a, 114b, 116a and 116b. Active regions 114a, 114b and gate 120 will respectively form the drain, source and gate regions of the N-channel transistor 106. Similarly, active regions 116a, 116b and gate 122 will respectively form the source, drain and gate regions of the P-channel transistor 108.

Figure 1B:
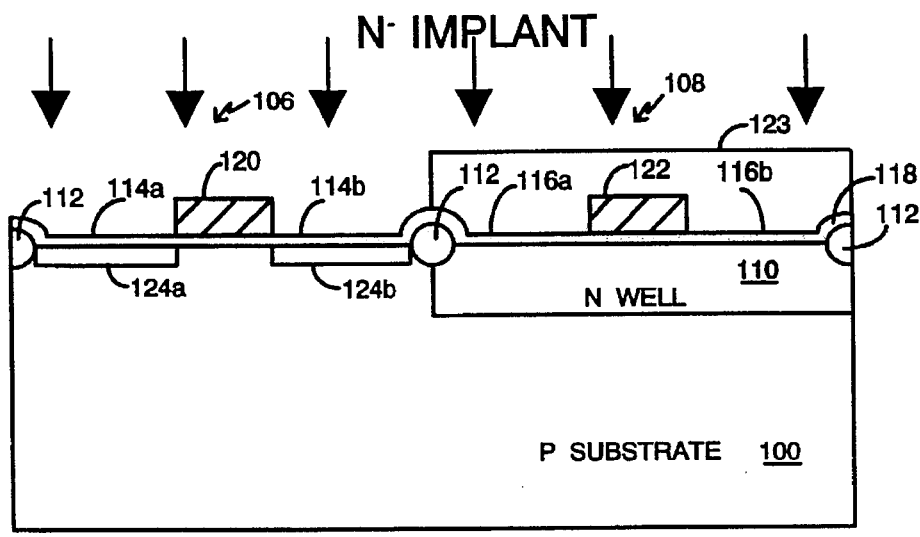

In a first masking step and a first ion implant step, shown in FIG. 1B, a layer of photoresist material 123 is selectively formed over the substrate 100 which effectively masks off gate structure 122, and active regions 116a and 116b. Then, a $N^-$ implant is used to form N-channel transistor lightly doped regions 124a and 124b which are self-aligned with the gate 120.

Figure 1C:
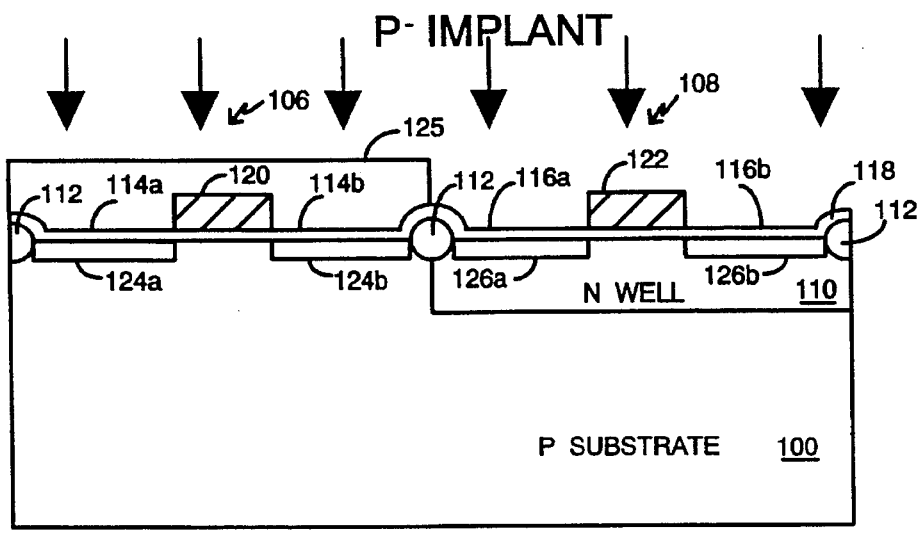
Figure 1D:
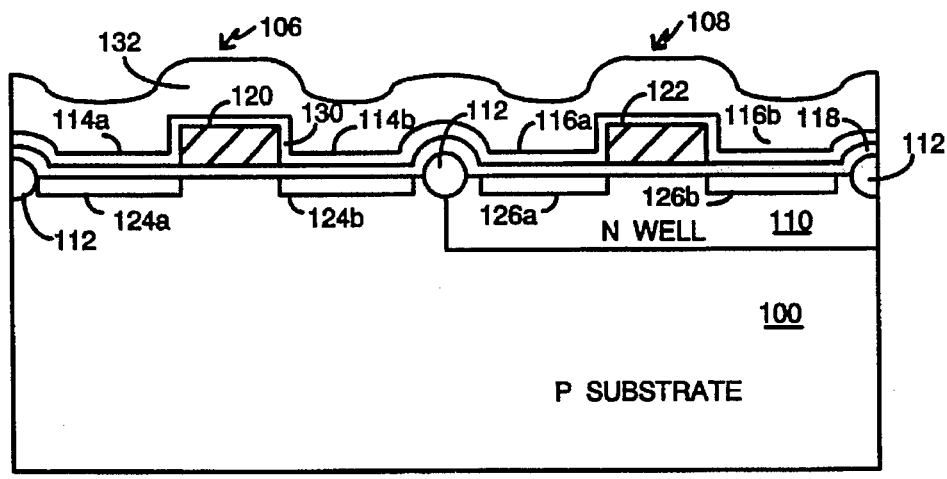

Similarly, in a second masking step and a second ion implant step, shown in FIG. 1C, a layer of photoresist material 125 is selectively formed over the substrate 100 which effectively masks off gate structure 120, and N-channel lightly doped regions 124a and 124b. Then, a $P^-$ implant is used to form P-channel transistor lightly doped regions 126a and 126b which are self-aligned with the gate 122. Portions of lightly doped regions 124a, 124b, 126a and 126b will become the LDD regions of a CMOS transistor formed on P-substrate 100. A thin etch stop layer 130 (approximately 200–500 Å) is formed over substrate 100, gates 120 and 122, and gate oxide 118 as shown in FIG. 1D. The etch stop layer 130 may be a silicon nitride ($Si_3N_4$) layer formed using conventional techniques. A spacer material layer 132, is then formed over nitride layer 130. The spacer material layer 132 may be formed of silicon dioxide ($SiO_2$). Etch stop layer 130 and spacer material layer 132 may be formed of other materials provided that the selected materials may be selectively etched with respect to each other.

Figure 1E:
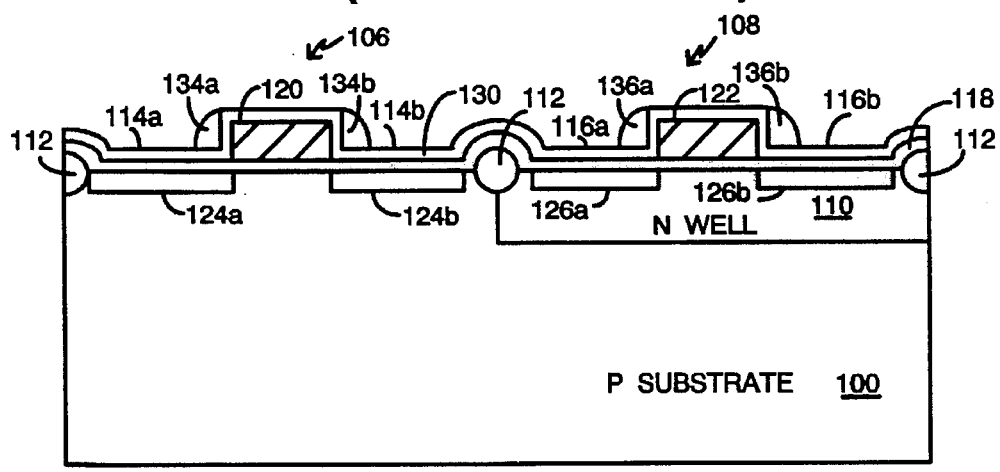

An etchant which selectively etches the spacer material layer 132, i.e., etches the spacer material layer 132 at a faster rate than etch stop layer 130, may be used to etch spacer material layer 132 until only spacers 134a and 134b, and 136a and 136b respectively remain at the ends of gates 120 and 122, as shown in FIG. 1E. Etch stop layer 130 is not penetrated by the etchant during the etching of spacer material layer 132, and thus field oxide regions 112 are protected and oxide loss is prevented.

Figure 1F:
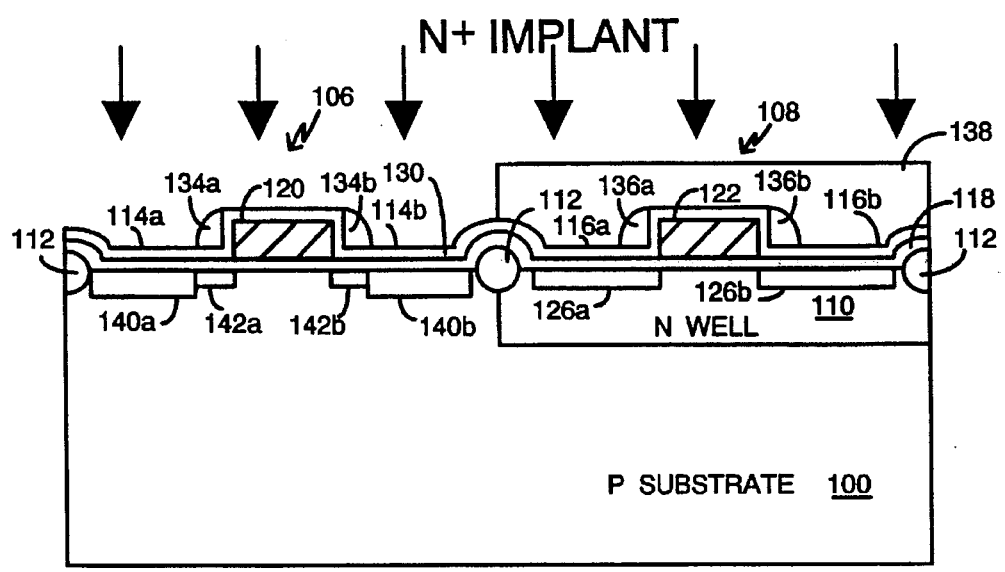

After the formation of spacers 134a, 134b, 136a and 136b, a third masking and third ion implant step is performed as shown in FIG. 1F. A layer of photoresist material 138 is selectively formed over the substrate 100 which effectively masks off gate structure 122, and the P-channel lightly doped regions 126a and 126b. Then, an $N^+$ implant is performed to form $N^+$ source region 140b and $N^+$ drain region 140a in portions of the lightly doped regions 124b and 124a respectively. Spacers 134a and 134b serve as masks to prevent ion implantation in the portions of lightly doped regions 124a and 124b underlying spacers 134a and 134b. These protected portions of the lightly doped regions 124a and 124b are the respective LDD region 142a and lightly doped source ("LDS") region 142b of the N-channel transistor 106.

Figure 1G:
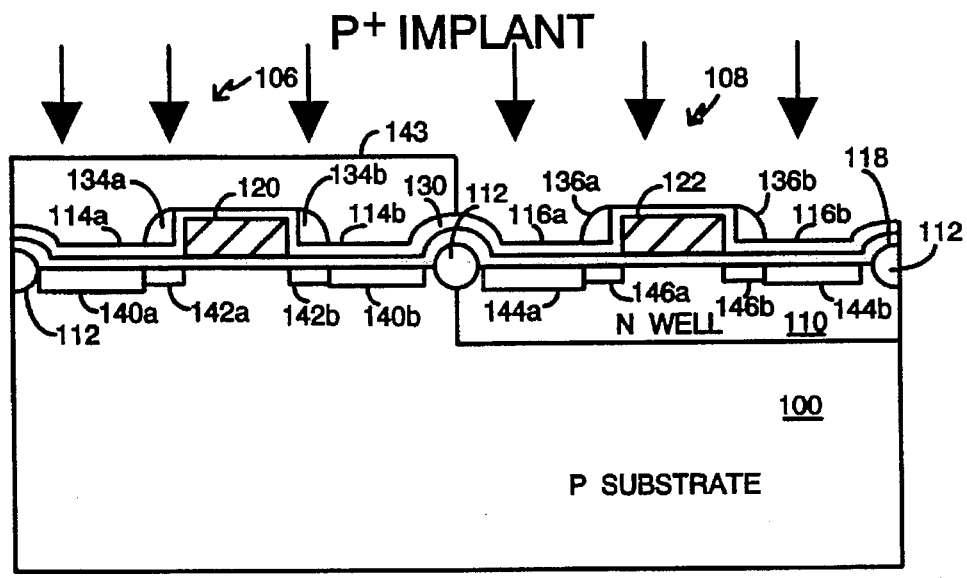

Similarly, in a fourth masking step and a fourth ion implant step, shown in FIG. 1G, a layer of photoresist material 143 is selectively formed over the substrate 100 which effectively masks off gate structure 120, and the N-channel $N^+$ source region 140b and $N^+$ drain region 140a. Then, a $P^+$ implant is performed to form $P^+$ source region 144a and $P^+$ drain region 144b in portions of the lightly doped regions 126a and 126b respectively. Spacer 136a and 136b serve as masks to prevent ion implantation in the portions of lightly doped regions 126a and 126b underlying spacers 136a and 136b. These protected portions of the lightly doped regions 126a and 126b are the respective LDS region 146a and LDD region 146b of the P-channel transistor 108.

Figure 1H:
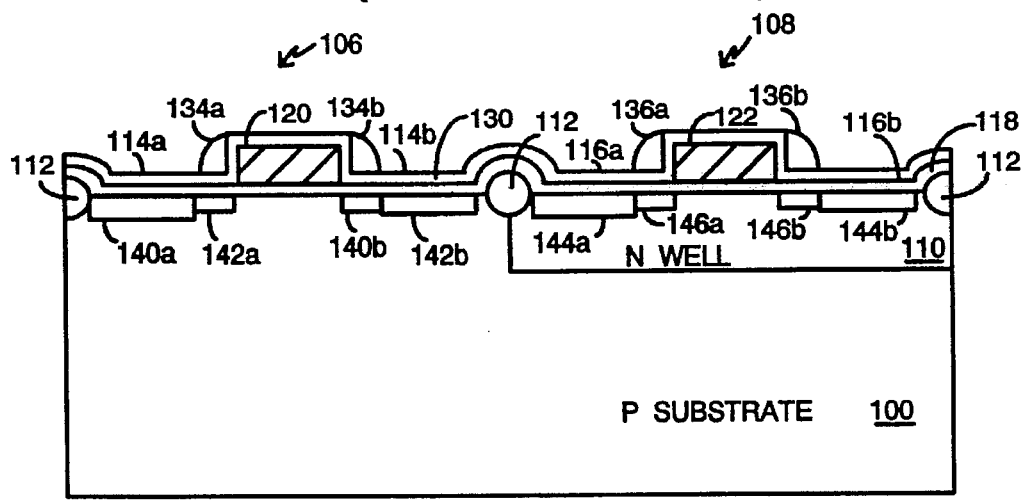

Referring to FIG. 1H, the photoresist layer 143 is stripped leaving the spacers 134a, 134b, 136a, and 136b. Nitride layer 130 can be removed by a wet etch. Etchants useful in removing nitride layer 130 include transene (16 $H_3PO_4$:1 $HNO_3$:1 Acetic acid: 2 $H_2O$). As nitride layer 130 is removed, the removal process also lifts off spacers 134a, 134b, 136a and 136b.

While the conventional method is able to reduce oxide loss, it involves four masking steps to form the source, drain and LDD regions in a typical CMOS LDD fabrication process. The processing steps associated with each masking step adversely increase cycle time and process complexity and also introduce particles and defects, resulting in an increase in cost and yield loss. The present invention provides a method for forming FET transistors with LDD regions which minimizes oxide loss, while at the same time reducing the number of masking steps required. A CMOS LDD fabrication process in accordance with the present invention involves only two masking steps to form the source, drain and LDD regions.

Figure 1I:
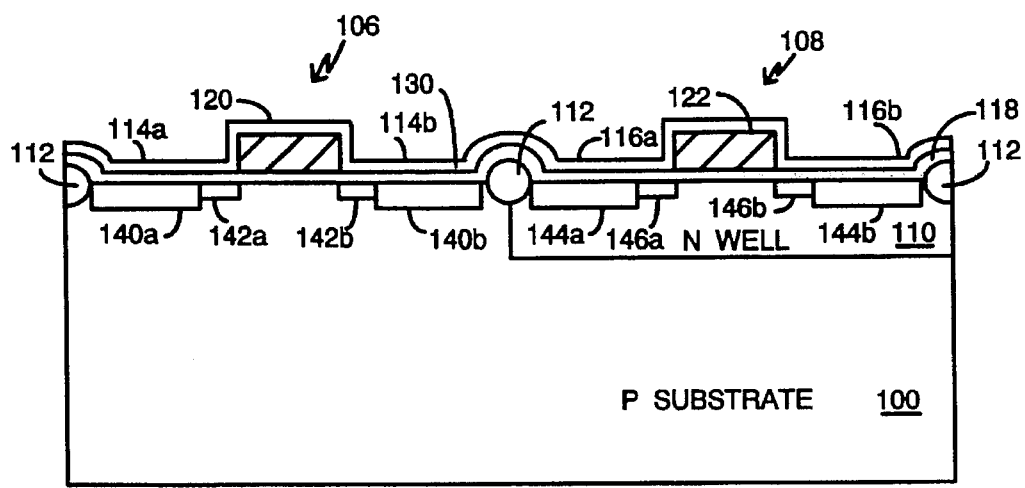
Figure 2A:
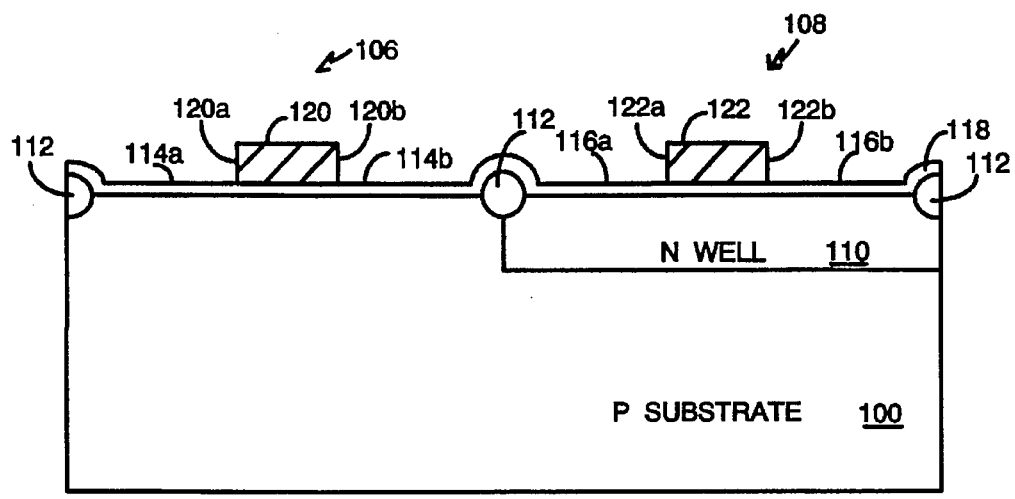
FIGS. 2A–2G are schematic, cross-sectional illustrations showing the various stages of a LDD process in accordance with the present invention for fabricating CMOS transistors in which only two masks are used.

FIG. 2A through 2G illustrate a LDD process for fabricating CMOS transistors in accordance with the present invention in which only two masks are required. For convenience of illustration, like reference numerals are used in FIG. 2A through 2G to denote like elements already described in FIG. 1A through 1I. FIG. 2A is identical to FIG. 1A already illustrated earlier which shows a P substrate 100 with an N-well region 110, and an N-channel transistor 106 and a P-channel transistor 108 formed thereon. The transistors 106 and 108 shown here are prior to source, drain and LDD ion implantation. The dopant types discussed are used for the purpose of illustration. Further, the method of the present invention applies to the fabrication of both enhancement mode and depletion mode devices. Using conventional fabrication techniques, field oxide regions 112 are formed on substrate 100 to define active regions 114a, 114b, 116a and 116b. A gate oxide layer 118 is provided on the active regions 114a, 114b, 116a and 116b and also over the field oxide regions 112. Thereafter, gate structures 120 and 122 are formed on the active regions 114a, 114b, 116a and 116b. Gate structures 120 and 122, respectively, have side edges 120a, 120b and 122a, 122b. Active regions 114a, 114b and gate 120 will respectively form the drain, source and gate regions of the N-channel transistor 106. Similarly, active regions 116a, 116b and gate 122 will respectively form the source, drain and gate regions of the P-channel transistor 108.

Figure 2B:
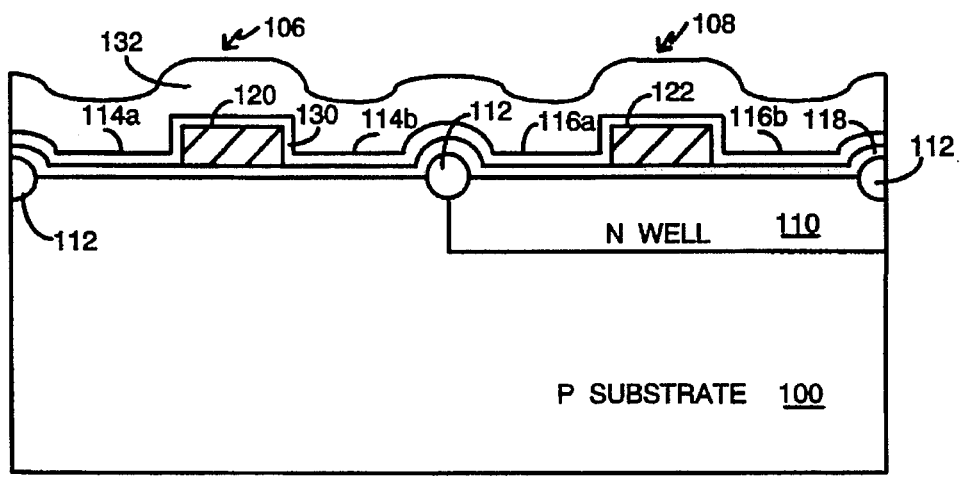

Next, a thin etch stop layer 130 (approximately 200–500 Å) is formed over substrate 100, gates 120 and 122, and gate oxide 118 as shown in FIG. 2B. The etch stop layer 130 may be a silicon nitride ($Si_3N_4$) layer formed using conventional techniques. A spacer material layer 132, is then formed over nitride layer 130. The spacer material layer 132 may be formed of silicon dioxide ($SiO_2$). Etch stop layer 130 and spacer material layer 132 may be formed of other materials provided that the selected materials may be selectively etched with respect to each other.

Figure 2C:
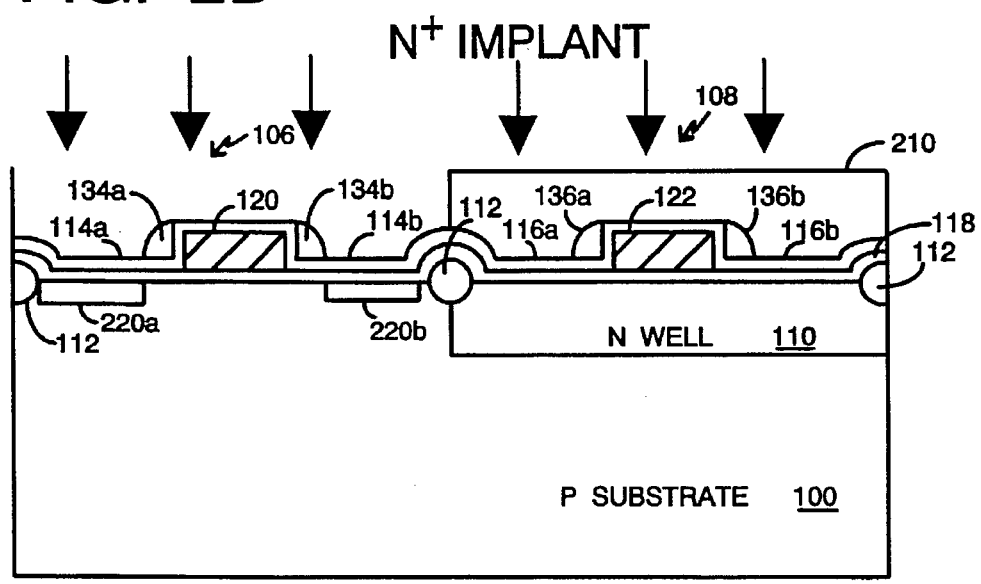

An etchant which selectively etches the spacer material layer 132, may be used to etch spacer material layer 132 until only spacers 134a and 134b, and 136a and 136b respectively remain at the ends of gates 120 and 122, as shown in FIG. 2C. Etch stop layer 130 is not penetrated by the etchant during the etching of spacer material layer 132, and thus field oxide regions 112 are protected and oxide loss is prevented.

In a first masking step and a first ion implant step, shown in FIG. 2C, a layer of photoresist material 210 is selectively formed over the P substrate 100 which effectively masks off gate structure 122, and active regions 116a and 116b. Then, a $N^+$ implant is used to form $N^+$ source region 220b and $N^+$ drain region 220a of N-channel transistor 106 which are self-aligned with the gate 120. Spacer 134a and 134b serve as masks to prevent ion implantation in the portions of active regions 114a and 114b underlying spacers 134a and 134b. Typical $N^+$ implant is performed with, for example, $As^+$ ions at 40 to 80 Kev with an implant dosage of, for example, $3 \times 10^{15}$ atoms per $cm^2$.

Figure 2D:
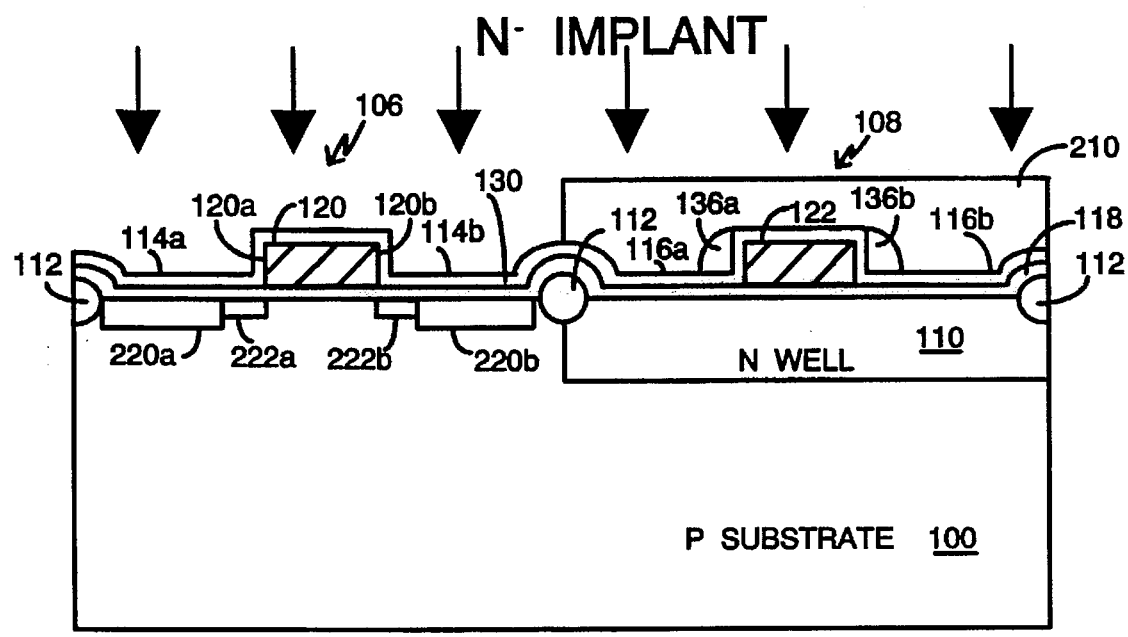
Figure 2E:
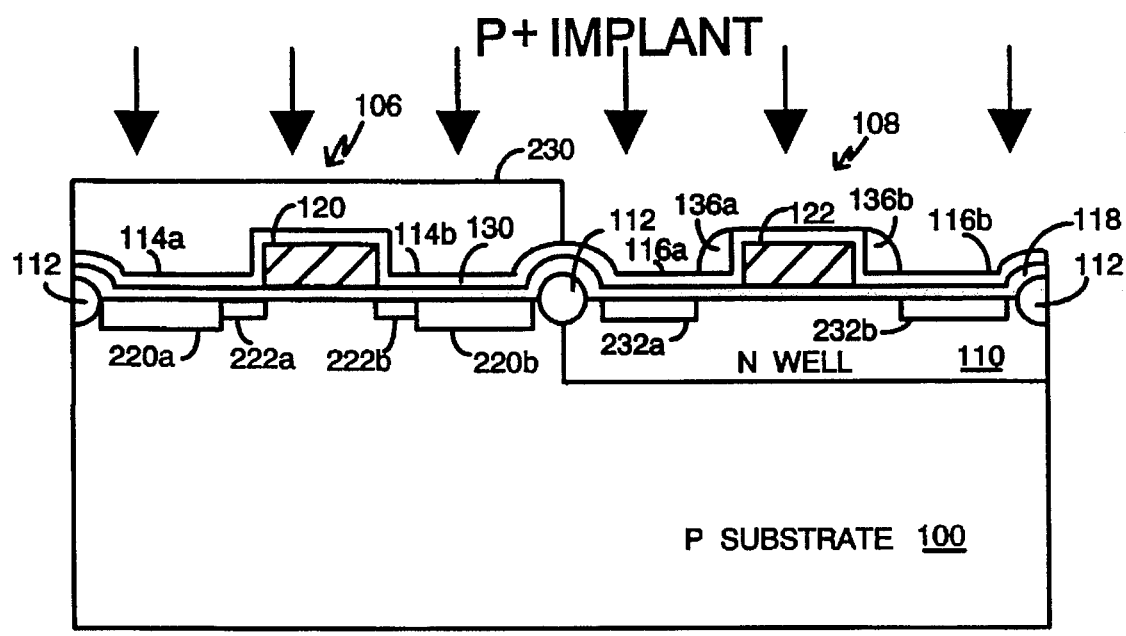

Next, the spacers 134a and 134b are removed by using buffered Hydrogen Fluoride ($H_2O$:HF=10:1) as shown in FIG. 2D, while leaving the photoresist layer 210 intact. Thereafter, a second ion implant step is performed in which $N^-$ implant is used to form N-channel transistor LDD region 222a and LDS region 222b which are respectively self-aligned with the side edges 120a and 120b of gate 120. An N-type dopant for use in implanting LDD region 222a and LDS region 222b may be, for example, phosphorus ions at 30 Kev with an implant dosage of, for example, $1\times10^{13}$ atoms per cm².

Then, the photoresist layer 210 is stripped off using conventional techniques. In a second masking step and a third ion implant step, shown in FIG. 2E, a layer of photoresist material 230 is selectively formed over the P substrate 100 which effectively masks off gate 122, and active regions 116a and 116b. Then, a P⁺ implant is used to form P⁺ source region 232a and P⁺ drain region 232b of P-channel transistor 108 which are self-aligned with the gate 122. Spacer 136a and 136b serve as masks to prevent ion implantation in the portions of active regions 116a and 116b underlying spacers 136a and 136b. Typical P⁺ implant is performed with, for example, $BF_2^+$ ion at 40 to 60 Kev with an implant dosage of, for example, $2\times10^{15}$ atoms per cm².

Figure 2F:
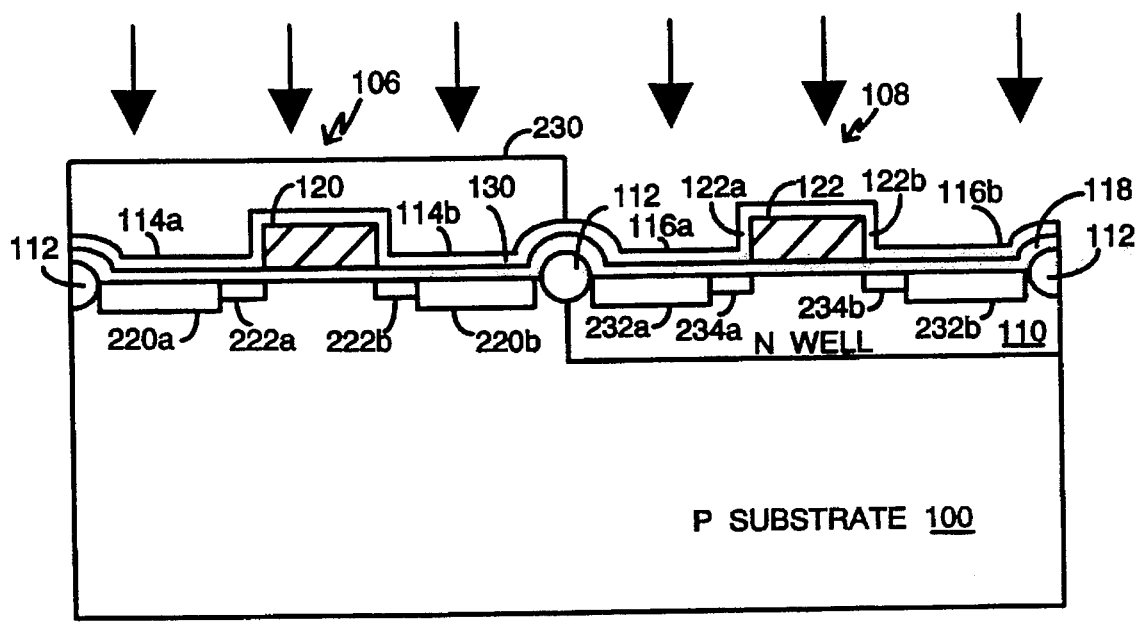

Next, the spacers 136a and 136b are removed by using buffered Hydrogen Fluoride ($H_2O:HF=10:1$) as shown in FIG. 2F, while leaving the photoresist layer 230 intact. Thereafter, a fourth ion implant step is performed in which P⁻ implant is used to form P-channel transistor LDD 234a and LDS 234b which are respectively self-aligned with the side edges 122a and 122b of gate 122. A P-type dopant for use in implanting lightly doped region 234a and 234b may be, for example, $BF^{2+}$ ions at 30 Kev with an implant dosage of, for example, $2\times10^{13}$ atoms per cm².

Figure 2G:
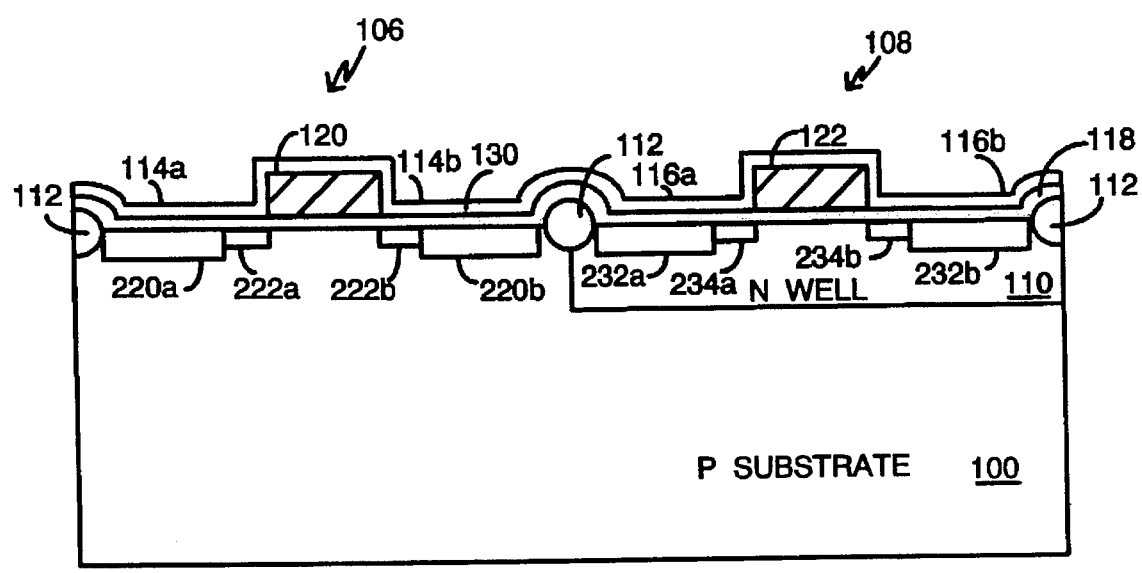

Referring to FIG. 2G, the photoresist layer 230 is stripped, leaving a CMOS transistor structure similar to what was shown in FIG. 1I. The etch stop layer 130 may be removed with hot phosphoric acid. Thus, by using the present invention, only two, instead of four, masking steps, are required to implement a CMOS LDD fabrication process which would minimize oxide loss.

Accordingly, by using the method of the present invention for forming FET transistors with LDD regions, one can minimizes oxide loss, while at the same time reducing the number of masking steps required. A CMOS LDD fabrication process in accordance with the present invention involves only two masking steps to form the source, drain and LDD regions. By eliminating two masking steps, the present invention provides a CMOS LDD processing method that reduces cycle time and process complexity and also minimizes particles and defects, resulting in a reduction in cost and yield loss.

The above described embodiments are merely illustrative of the present invention. Various alternate designs will become apparent to those skilled in the art after reading the above disclosure. It is to be understood that the scope of the invention is not limited merely to the above described embodiments.

What is claimed is:

1. A method of fabricating a field effect transistor having a lightly doped drain region, comprising the sequential steps of:
    (a) providing a substrate having an active region defined by field oxide regions;
    (b) providing a gate, having side edges, overlying a portion of said active region;
    (c) forming a nitride layer over said substrate including said gate;
    (d) forming an oxide layer over said nitride layer;
    (e) selectively etching said oxide layer with respect to said nitride layer to form oxide sidewall spacers about the side edges of said gate;
    (f) implanting heavily doped source and drain regions into said substrate and about the side edges of said gate using said oxide sidewall spacers as masks; and
    (g) implanting the lightly doped drain region about one of the side edges of said gate adjacent to said heavily doped drain region.

2. The method of claim 1 wherein said step of implanting heavily doped source and drain regions comprises removing said oxide sidewall spacers thereafter.

3. The method of claim 1 wherein said step of implanting the lightly doped drain region further comprises implanting a lightly doped source region about another one of the side edges of said gate adjacent to said heavily doped source region.

4. The method of claim 1 wherein said heavily doped source and drain regions and said lightly doped drain region are of the same conductivity type.

5. A method of fabricating a field effect transistor having a lightly doped drain region, comprising the sequential steps of:
    (a) providing a substrate having an active region defined by field oxide regions;
    (b) providing a gate, having side edges, overlying a portion of said active region;
    (c) forming a nitride layer over said substrate including said gate;
    (d) forming an oxide layer over said nitride layer;
    (e) selectively etching said oxide layer with respect to said nitride layer to form oxide sidewall spacers about the side edges of said gate;
    (f) implanting heavily doped source and drain regions into said substrate and about the side edges of said gate using said oxide sidewall spacers as masks;
    (g) removing said oxide sidewall spacers; and
    (h) implanting the lightly doped drain region about one of the side edges of said gate adjacent to said heavily doped drain region.

6. The method of claim 5 wherein said step of implanting the lightly doped drain region further comprises implanting a lightly doped source region about another one of the side edges of said gate adjacent to said heavily doped source region.

7. The method of claim 5 wherein said heavily doped source and drain regions and said lightly doped drain region are of the same conductivity type.

8. A method of fabricating a field effect transistor having a lightly doped drain region, comprising the sequential steps of:
    (a) providing a substrate having an active region defined by field oxide regions;
    (b) providing a gate, having side edges, overlying a portion of said active region;
    (c) forming a nitride layer over said substrate including said gate;
    (d) forming an oxide layer over said nitride layer;
    (e) selectively etching said oxide layer with respect to said nitride layer to form oxide sidewall spacers about the side edges of said gate;
    (f) implanting heavily doped source and drain regions of a conductivity type into said substrate and about the side edges of said gate using said oxide sidewall spacers as masks;
    (g) removing said oxide sidewall spacers; and
    (h) implanting the lightly doped drain region of said conductivity type about one of the side edges of said gate immediately adjacent to said heavily doped drain region.

9. The method of claim 8 wherein said step of implanting the lightly doped drain region further comprises implanting a lightly doped source region about another one of the side edges of said gate adjacent to said heavily doped source region.

10. A method of fabricating a complementary MOS transistor having first and second lightly doped drain regions, comprising the sequential steps of:

(a) providing a substrate having a first active region with a first conductivity type and a second active region with a second conductivity type defined by field oxide regions;

(b) providing a first gate, having side edges, overlying a portion of said first active region, and a second gate, having side edges, overlying a portion of said second active region;

(c) forming a nitride material layer over said substrate including said first and second gates;

(d) forming an oxide layer over said nitride layer;

(e) selectively etching said oxide layer with respect to said nitride material layer form oxide sidewall spacers about the side edges of said first and second gates;

(f) forming a first disposable barrier material layer over selected areas of the substrate including said second active region and excluding said first active region using a first mask;

(g) implanting first heavily doped source and drain regions of said second conductivity type into said substrate and about the side edges of said first gate using said oxide sidewall spacers as second masks while said second active area is protected by said first disposable barrier material layer; and (h) implanting the first lightly doped drain region of said second conductivity type about one of the side edges of said first gate adjacent to said first heavily doped drain region while said second active area is protected by said first disposable barrier material layer.

11. The method of claim 10, further comprising the sequential steps of:

(a) after implanting the first lightly doped drain region of said second conductivity type, forming a second disposable barrier material layer over selected areas of the substrate including said first active region and excluding said second active region using a third mask;

(b) implanting second heavily doped source and drain regions of said first conductivity type into said substrate and about the side edges of said second gate using said oxide sidewall spacers as fourth masks while said first active area is protected by said second disposable barrier material layer; and (c) implanting the second lightly doped drain region of said first conductivity type about one of the side edges of said second gate adjacent to said second heavily doped drain region while said first active area is protected by said second disposable barrier material layer.

12. The method of claim 11 wherein said step of implanting said first heavily doped source and drain regions comprises removing said oxide sidewall spacers about the side edges of said first gates thereafter and said step of implanting said second heavily doped source and drain regions comprises removing said oxide sidewall spacers about the side edges of said second gates thereafter.

13. The method of claim 11 wherein said step of implanting the first lightly doped drain region comprises implanting a first lightly doped source region about another one of the side edges of said first gate adjacent to said first heavily doped source region and said step of implanting the second lightly doped drain region comprises implanting a second lightly doped source region about another one of the side edges of said second gate adjacent to said second heavily doped source region.

14. The method of claim 11 wherein said first conductivity type is P conductivity type and said second conductivity type is N conductivity type.

15. The method of claim 11 wherein said first conductivity type is N conductivity type and said second conductivity type is P conductivity type.

16. A method of fabricating a complementary MOS transistor having a first and a second lightly doped drain regions, comprising the sequential steps of:

(a) providing a substrate having a first active region with a first conductivity type and a second active region with a second conductivity type defined by field oxide regions;

(b) providing a first gate, having side edges, overlying a portion of said first active region, and a second gate, having side edges, overlying a portion of said second active region;

(c) forming a first barrier material layer over said substrate including said first and second gates, wherein said first barrier material layer is composed of nitride; and (d) forming an oxide layer over said first barrier material layer;

(e) selectively etching said oxide layer with respect to said first barrier material layer to form oxide sidewall spacers about the side edges of said first and second gates;

(f) forming a second disposable barrier material layer over selected areas of the substrate including said second active region and excluding said first active region using a first mask;

(g) implanting first heavily doped source and drain regions of said second conductivity type into said substrate and about the side edges of said first gate using said oxide sidewall spacers as second masks while said second active area is protected by said second disposable barrier material layer;

(h) removing said oxide sidewall spacers along the side edges of said first gate;

(i) implanting the first lightly doped drain region of said second conductivity type about one of the side edges of said first gate adjacent to said first heavily doped drain region while said second active area is protected by said second disposable barrier material layer;

(j) forming a third disposable barrier material layer over selected areas of the substrate including said first active region and excluding said second active region using a third mask;

(k) implanting second heavily doped source and drain regions of said first conductivity type into said substrate and about the side edges of said second gate using said oxide sidewall spacers as fourth masks while said first active area is protected by said third disposable barrier material layer;

(l) removing said oxide sidewall spacers along the side edges of said second gate; and (m) implanting the second lightly doped drain region of said first conductivity type about one of the side edges of said second gate adjacent to said second heavily doped drain region while said first active area is protected by said second disposable barrier material layer.

17. The method of claim 16 wherein said step of implanting the first lightly doped drain region comprises implanting a first lightly doped source region about another one of the side edges of said first gate adjacent to said first heavily doped source region and said step of implanting the second lightly doped drain region comprises implanting a second lightly doped source region about another one of the side edges of said second gate adjacent to said second heavily doped source region.

18. The method of claim 16 wherein said first conductivity type is P conductivity type and said second conductivity type is N conductivity type.

19. The method of claim 16 wherein said first conductivity type is N conductivity type and said second conductivity type is P conductivity type.

20. A method of fabricating a complementary MOS transistor having a lightly doped N conductivity region and a lightly doped P conductivity drain region, comprising the sequential steps of:

(a) providing a substrate having a first active region with a P conductivity type and a second active region with a N conductivity type defined by field oxide regions;

(b) providing a first gate, having side edges, overlying a portion of said first active region, and a second gate, having side edges, overlying a portion of said second active region;

(c) forming a nitride layer over said substrate including said first and second gates; and (d) forming an oxide layer over said nitride layer;

(e) selectively etching said oxide layer with respect to said nitride layer to form sidewall spacers about the side edges of said first and second gates;

(f) forming a first photoresist material layer over selected areas of the substrate including said second active region and excluding said first active region using a first mask;

(g) implanting first heavily doped source and drain regions of N conductivity type into said substate and about the side edges of said first gate using said oxide sidewall spacers as second masks while said second active area is protected by said first photoresist material layer;

(h) removing said oxide sidewall spacers about the side edges of said first gate;

(i) implanting the first lightly doped drain region of N conductivity type about one of the side edges of said first gate adjacent to said first heavily doped N conductivity type drain region while said second active area is protected by said first photoresist material layer;

(j) forming a second photoresist material layer over selected areas of the substrate including said first active region and excluding said second active region using a third mask;

(k) implanting heavily doped source and drain regions of P conductivity type into said substrate and about the side edges of said second gate using said oxide sidewall spacers as fourth masks while said first active area is protected by said second photoresist material layer;

(l) removing said oxide sidewall spacers about the side edges of said second gate; and (m) implanting the second lightly doped drain region of P conductivity type about one of the side edges of said second gate adjacent to said heavily doped P conductivity type drain region while said first active area is protected by said second photoresist material layer.

21. The method of claim 20 wherein said step of implanting the first lightly doped drain region comprises implanting a first lightly doped source regin about another one of the side edges of said first gate adjacent to said first heavily doped source region and said step of implanting the second lightly doped drain region comprises implanting a second lightly doped source region about another one of the side edges of said second gate adjacent to said second heavily doped source region.

* * * * *